United States Patent
Lundén et al.

(10) Patent No.: US 9,589,753 B2
(45) Date of Patent: Mar. 7, 2017

(54) METHOD FOR CONTROLLING A CONTACTOR DEVICE, AND CONTROL UNIT

(71) Applicant: ABB Schweiz AG, Baden (CH)

(72) Inventors: Björn Lundén, Järfälla (SE); Gunnar Johansson, Västerås (SE); Lars Andersson, Solna (SE)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/033,368

(22) PCT Filed: Nov. 12, 2013

(86) PCT No.: PCT/EP2013/073611
§ 371 (c)(1),
(2) Date: Apr. 29, 2016

(87) PCT Pub. No.: WO2015/070894
PCT Pub. Date: May 21, 2015

(65) Prior Publication Data
US 2016/0293363 A1    Oct. 6, 2016

(51) Int. Cl.
*H01H 47/00* (2006.01)
*H01H 47/04* (2006.01)
(Continued)

(52) U.S. Cl.
CPC ......... *H01H 47/04* (2013.01); *G01R 19/2506* (2013.01); *H01H 47/32* (2013.01); *H01H 47/325* (2013.01)

(58) Field of Classification Search
CPC .............................. H01H 47/04; G01R 19/2506
(Continued)

(56) References Cited

U.S. PATENT DOCUMENTS

| 4,516,185 A | 5/1985 | Culligan et al. |
| 5,235,303 A * | 8/1993 | Xiao ............... H01F 7/1623 335/132 |

(Continued)

FOREIGN PATENT DOCUMENTS

| EP | 2299459 A1 | 3/2011 |
| EP | 2551881 A1 | 1/2013 |
| WO | 2011095223 A1 | 8/2011 |

OTHER PUBLICATIONS

International Search Report Application No. PCT/EP2013/073611 Completed: Jul. 3, 2014;Mailing Date: Jul. 11, 2014 5 pages.
(Continued)

*Primary Examiner* — Stephen W Jackson
(74) *Attorney, Agent, or Firm* — Whitmyer IP Group LLC

(57) ABSTRACT

A method in a control unit for closing a contactor device. The control unit is configured to enable the movement between the closed and opened position by energizing a coil of an electromagnetic circuit. The method includes applying a voltage over the coil; determining, during a first period of time, current through the coil and voltage over the coil and estimating based thereon model parameters for a model predicting the behavior of the current through the coil if the contactor device were to stay in an open position, and measuring, after the ending of the first period of time, current through the coil and determining a difference between, on the one hand the measured current and, on the other hand a predicted current of the model, and repeating the measuring and determining until a state change from open position to closed position is detected by the difference in current.

18 Claims, 7 Drawing Sheets

(51) Int. Cl.
*G01R 19/25* (2006.01)
*H01H 47/32* (2006.01)

(58) Field of Classification Search
USPC .......................................................... 361/160
See application file for complete search history.

(56) References Cited

U.S. PATENT DOCUMENTS

| | | |
|---|---|---|
| 5,255,152 A | 10/1993 | Estes, III et al. |
| 5,406,440 A | 4/1995 | Wieloch |
| 5,539,608 A * | 7/1996 | Hurley ............... G01R 31/3278 361/152 |
| 5,652,691 A | 7/1997 | Fowler |
| 5,910,890 A | 6/1999 | Hansen et al. |
| 2013/0083444 A1 | 4/2013 | Barnes et al. |

OTHER PUBLICATIONS

Written Opinion of the International Searching Authority Application No. PCT/EP2013/073611 Mailing Date: Jul. 11, 2014 6 pages.

* cited by examiner

METHOD FOR CONTROLLING A CONTACTOR DEVICE, AND CONTROL UNIT

TECHNICAL FIELD

The technology disclosed herein relates generally to the field of contactors used in electrical networks, and in particular to contactors the operation of which is controlled by electronics.

BACKGROUND

Within electrical networks contactors are often used for switching large electric currents. These contactors are designed for switching load currents that occur during normal conditions in various applications. The contactor is designed so as to be able to make, conduct and break the electric current.

Electromagnetically operated contactors typically comprise a spring-biased armature moving between two end positions. The armature is a part of an electromagnetic circuit. At a first end position the armature is open and the current path is then open, and at a second end position, the armature is closed and the contactor is then closed, thereby providing an electrical path. Normally contactors are monostable devices and the position of rest is the open position but the opposite positions are sometimes used. At the first end position there is thus no electric path and the electric circuit is open, at the second position the electric path is closed and the electric circuit is then closed. The movement of the armature is accomplished by energizing a coil of the electromagnetic circuit, the coil typically being wound around parts of either the armature or around a fixed part of the electromagnetic circuit.

Operation of such contactor entails applying a current to the coil, whereby a magnetic flux is produced in the electromagnet. The magnetic flux attracts the armature, which forces contacts of the contactor to close. Contactors need high coil current during closing (often also called "making" or "make"), since an air gap between two magnet parts of the electromagnet is large and the spring force of springs in the armature needs to be overcome. When holding the contactor closed, denoted "hold state", the air gap is small and a low coil current is sufficient.

In order to secure reliable contact making, a high current is applied to the coil for a fixed period of time including a safety margin, before switching to the hold state with low current. The application of high current during the closing creates losses and increased temperature in the coil, and the period with high current after the contactor has closed results in wasted energy. The wasted energy corresponds to unnecessary additional supply power, with entailing increased costs. Operating energy is often supplied by sources with limited capacity and therefore it is desired to minimize the energy used. The wasted energy also increases the temperature in the coil as well as in other electronics, which may adversely affect their functionality and reduce their operational time.

SUMMARY

An object of the present teachings is to solve or at least alleviate one or more of the above mentioned problems.

The object is according to a first aspect achieved by a method performed in a control unit for closing a contactor device. The contactor device is movable between a closed position in which a current is allowed to flow in a current path and an open position in which the current path is broken. The control unit is configured to enable the movement between the closed position and the open position by energizing a coil of an electromagnetic circuit. The method comprises applying voltage over the coil; determining, during a first period of time, current through the coil and voltage over the coil and estimating based thereon model parameters for a model predicting the behavior of the current through the coil if the contactor device were to stay in an open position; and measuring, after the ending of the first period of time, current through the coil and determining a difference between, on the one hand the measured current and, on the other hand a predicted current of the model, and repeating the measuring and determining until a state change from open position to closed position is detected by the difference in current.

The method for closing a contactor device enables the use of a reduced pull-in energy, and thus a lower energy consumption is provided. This may lower the costs by reduced need of power supply, e.g. by relieved requirements for capacitor banks or size thereof. The reduced energy waste also enables reduced temperature in the coil and other electronics, prolonging the operational time as well as functioning. This in turn also allows for the contactor device to be run at higher operating frequencies, i.e. higher intermittence or duty factor.

The object is according to a second aspect achieved by a control unit for closing a contactor device. The contactor device is movable between a closed position in which a current is allowed to flow in a current path and an open position in which the current path is broken. The control unit is configured to enable the movement between the closed position and the open position by energizing a coil of an electromagnetic circuit. The control unit is configured to: apply a voltage over the coil; determine, during a first period of time, current through the coil and voltage over the coil and estimating based thereon model parameters for a model predicting the behavior of the current through the coil if the contactor device were to stay in an open position; and measure, after the ending of the first period of time, current through the coil and determining a difference between, on the one hand the measured current and, on the other hand a predicted current of the model, and repeating the measuring and determining until a state change from open position to closed position is detected by the difference in current.

Further features and advantages of the present teachings will become clear upon reading the following description and the accompanying drawings.

DETAILED DESCRIPTION

Figure 1:
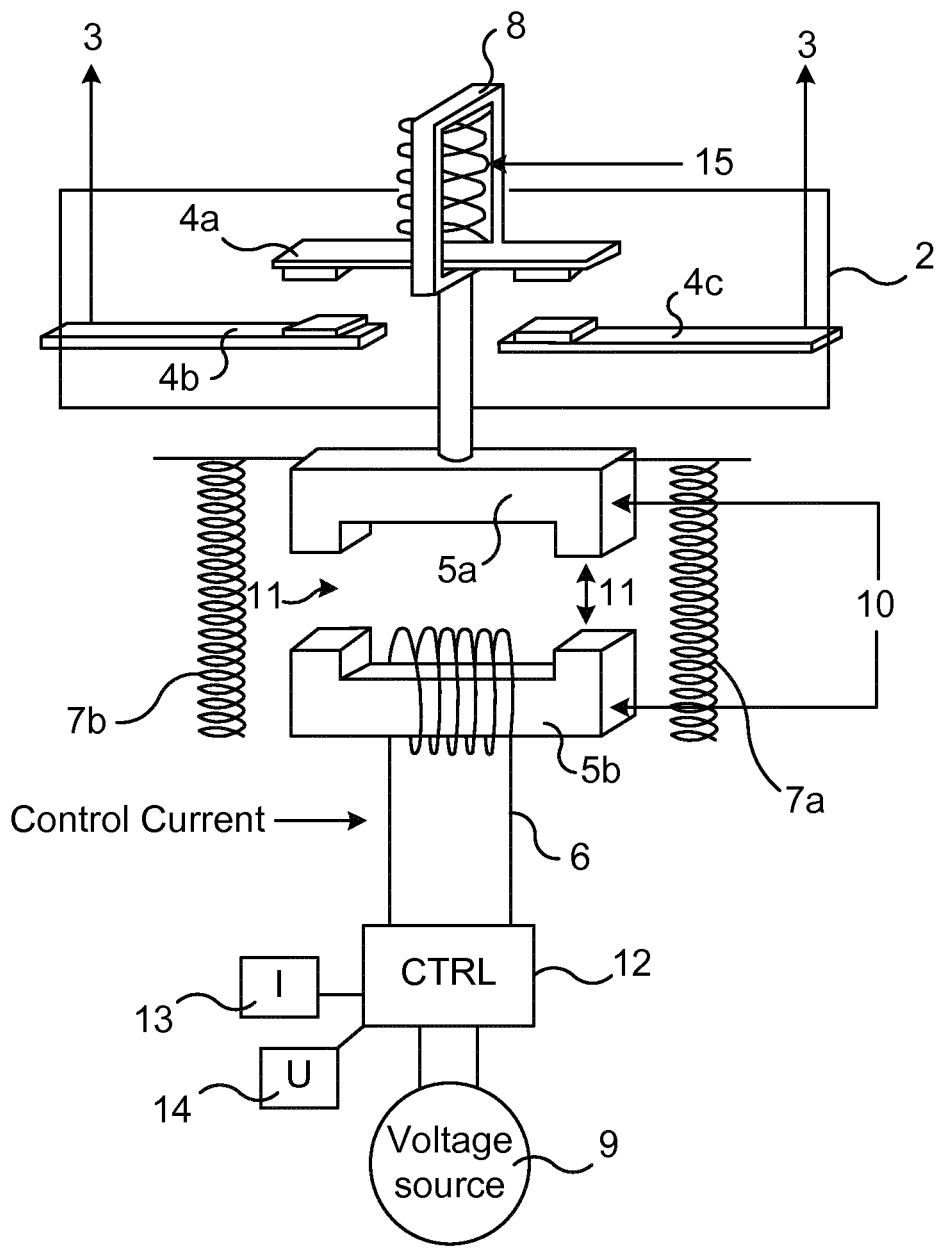
FIG. 1 illustrates an electromagnetically operated contactor device.

In the following description, for purposes of explanation and not limitation, specific details are set forth such as particular architectures, interfaces, techniques, etc. in order to provide a thorough understanding. In other instances, detailed descriptions of well-known devices, circuits, components and methods are omitted so as not to obscure the description with unnecessary detail. Same reference numerals refer to same or similar elements throughout the description.

FIG. 1 illustrates an electromagnetically operated contactor device 1, for which the present teachings may be applied. The exemplifying contactor device 1 comprises a contact part 2 arranged to make or break an electric path 3, e.g. to control the electric path in an electrical circuit. The contact part 2 comprises a moving contact element 4a, and first and second fixed contact elements 4b, 4c denoted fixed contact elements 4b, 4c in the following. When the fixed contact elements 4b, 4c are in mechanical contact with the moving contact element 4a, there is a closed electrical path 3, else the electrical path is broken (open).

The contactor device 1 further comprises an electromagnet 10. The electromagnet 10 comprises a moving magnet part 5a, a fixed magnet part 5b and a coil 6. In the following, the combination of the moving magnet part 5a and the fixed magnet part 5b is also denoted magnets 5a, 5b. The magnets 5a, 5b are movable in relation to each other and the fixed magnet part 5b may for example be bolted to a wall or the like. The magnets 5a, 5b, which may be U-shaped, are for example, and as is well recognized within the art, arranged so that the two leg parts of the moving U-shaped magnet part 5a have essentially the same axial extension as the corresponding two leg parts of the fixed U-shaped magnet part 5b. The leg parts of the U-shaped magnets 5a, 5b thus have opposing end surfaces, between which an air gap 11 is created. It is noted that the electromagnet 10 may alternatively be designed in any other conventional manner. There is thus an air gap 11 between the moving magnet part 5a and the fixed magnet part 5b, the size of which depends on the state of the contactor device 1.

The coil 6 may be wound around one or more parts of the magnet 5a, 5b. The coil 6 is connected to a voltage source 9 and when energizing the coil 6 a magnetic field is produced in the magnets 5a, 5b.

The electromagnet 10 is mechanically connected to a contact carrier 8, in the following denoted carrier 8. In particular, the moving magnet part 5a of the electromagnet 10 is mechanically connected to the carrier 8. The carrier 8 is mechanically connected also to the moving contact element 4a. A spring element 15 (also denoted contact spring) may then be arranged in the carrier 8, in order to bias the moving contact element 4a, for example by being arranged between the carrier 8 and the moving contact element 4a.

The carrier 8 is arranged to separate the moving contact element 4a of the contact part 2 from the fixed contact elements 4b, 4c of the contact part 2, thus breaking the electrical path 3. The carrier 8 is also arranged to close contact between the moving contact element 4a and the fixed contact elements 4b, 4c, thus closing the electrical path 3 and allowing electric current to flow. The carrier 8 is arranged to accomplish this by being movable between two end positions. The movement in turn is accomplished by means of the electromagnet 10.

When the coil 6 is not energized, i.e. when the coil 6 is without electrical current, spring elements 7a, 7b (also denoted separation springs) are arranged to press the moving magnet part 5a apart from the fixed magnet part 5b thus increasing the air gap 11, and putting the contactor device 1 in its open position, i.e. the moving contact element 4a is not interconnecting the fixed contact elements 4b, 4c.

When an electric voltage is applied to the coil 6, a current is flowing in the coil 6 and the magnets 5a, 5b become magnetized. The magnetic field thereby generated attracts the magnets 5a, 5b to each other. When sufficient current is flowing in the coil 6 the carrier 8 starts moving (in the downwards direction in the set-up of FIG. 1). The current that is required to move the carrier 8 (in FIG. 1, moving it downwards), and thus the moving contact element 4a, to a closed position is much higher than the current needed to maintain it closed. The air gap 11, that is large in the open position, has to be closed, which requires the spring force of the spring elements 7a, 7b to be overcome. During hold, the air gap 11 is small and a low coil current is sufficient to keep it closed. Further, during the hold state, the spring element 15 arranged in the carrier 8 keeps the contacts 4a, 4b closed with a springforce.

A control unit 12 is provided for controlling the contactor device 1, and in particular the opening and closing thereof. The control unit 12 comprises means, e.g. circuitry, electronic circuits, processing circuitry, memory, voltage sources and devices etc., for energizing the coil 6 and controlling the movement of the carrier 8 as well as controlling other operations of the contactor device 1. Circuitries, or sensor devices, for determining coil current and coil voltage, are illustrated at reference numerals 13 and 14, and may be part of the control unit 12, or may be separately arranged devices which provide the control unit 12 with measurement values.

Figure 2:
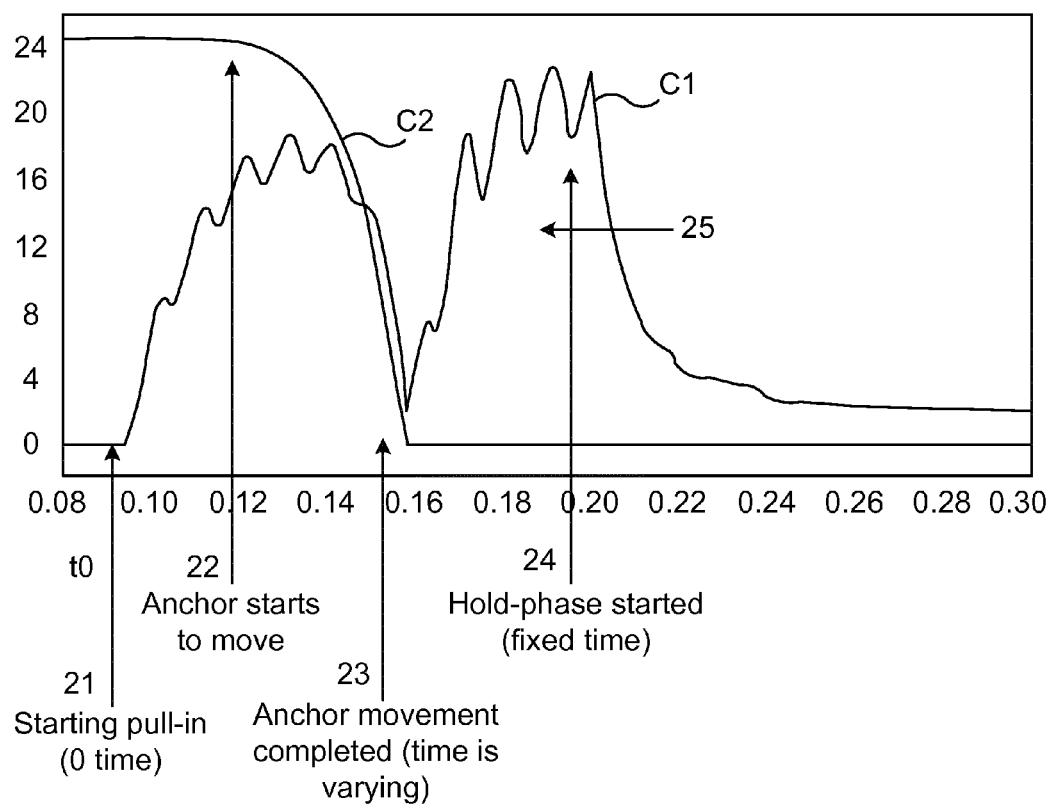
FIG. 2 illustrates graphs over coil current and carrier movement during a closing procedure.

Today, it is difficult to reliably detect the time instant when a contactor device 1 reaches its closed position, and instead a fixed time is often applied with an additional safety margin, during which time the current/voltage is high. This results, as explained in the background section, in energy being wasted. FIG. 2 illustrates this waste of energy.

In particular, in FIG. 2, two graphs are shown: graph C1 illustrates current (measured in ampere A) through the coil 6 over time and graph C2 illustrates the position of the carrier 8 between the open and closed end positions over time. Arrow denoted with reference numeral 21 indicates the starting point of the pull-in of the contactor device 1, and after applying a voltage over the coil 6, the coil current increases (graph C1) and the carrier 8 starts moving (arrow 22, graph C2). During the closing of the contactor 1 the coil current varies as the magnetizing current used often is rectified alternating current, but when the carrier 8 movement is completed (arrow 23) the coil current reaches a minimum caused by the variation of the inductance, as opposed to other minima resulting from variations in voltage.

The coil current varies, and is e.g. reduced when the carrier 8 starts moving since the change of inductance of the coil 6 produces a counteracting voltage. The time elapsed from start of carrier 8 movement to the movement being completed varies. The coil current is therefore, in prior art, kept at the high level during a hold-phase (arrow 24, graph C21). As mentioned, this hold-phase is set to a fixed time including an extra period of time for safety reasons. Arrow 25 pointing at the hatched area illustrates the energy being wasted during the hold phase.

It is noted that the use of a reduction of the current could be used for detecting the closing. However, this would be a less reliable alternative than the solution according to the present teachings, since the current may be reduced for other reasons as well, for example due to variations in voltage. It would be difficult to reliably detect the desired electrical current minimum.

Briefly, in an aspect of the present teachings, the energy required after contact making is kept at a minimum. This is accomplished without compromising on any safety aspects. In particular, the present teachings determines, e.g. by using sensors, carrier 8 states based on electric current in the coil 6 and electric voltage over the coil 6, thus using current and voltage as measured properties. In different aspects, the present teachings enables adaptive change of states from controlled pull-in voltage to controlled hold current, thereby reducing the required energy significantly compared to known methods.

Figure 3:
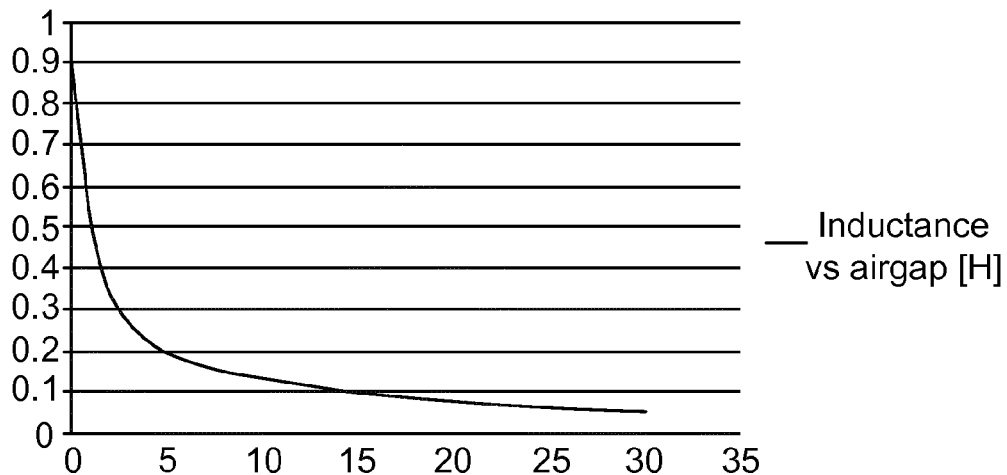
FIG. 3 illustrates a graph over inductance of a coil as function of carrier movement.

FIG. 3 illustrates how the inductance of the coil 6 changes as the air gap 11 changes, i.e. as the carrier 8 moves during the closing procedure from its open position to its closed position. As can be seen by the graph, the inductance of the coil 6 is reduced as function of the size of the air gap 11. Changed inductance causes coil current to change behavior, which fact may be used in accordance with the present teachings, in order to determine the carrier 8 position, and in particular to determine when the carrier 8 reaches or leaves a "hold position".

Figure 4:
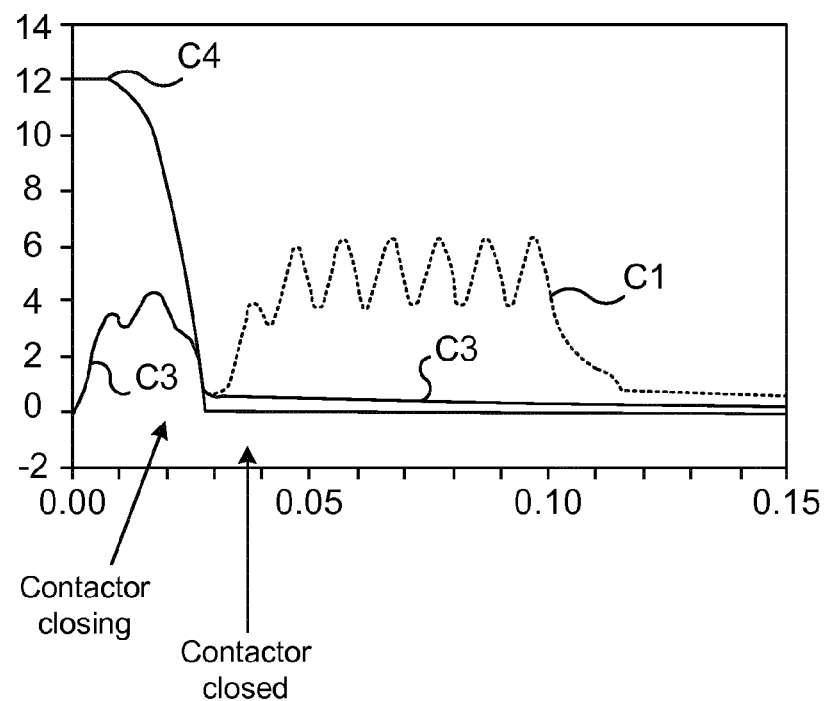
FIG. 4 illustrates graphs over coil current and carrier movement during a closing procedure for an aspect of the present teachings.

Turning now to FIG. 4, a change in coil current can be detected and used for determining when the contactor device 1 reaches its closed position. In particular, FIG. 4 illustrates graphs over coil current and carrier movement during a closing procedure in an aspect of the present teachings. The carrier 8 position is shown by graph C4 and the coil current by graph C3. For comparison, the graph C1 drawn in broken line is provided and illustrates the original current profile (compare FIG. 2). The closing procedure of the contactor device 1 starts (arrow 30) at time t0 and ends at time t1 when the closing procedure is finished and the contactor device 1 thus is closed (arrow 31). When a voltage is applied, e.g. using voltage source 9, current goes through the coil 6 of the electromagnet 10, and the carrier 8 starts moving so as to close the contactor device 1, in particular by the moving contact element 4a interconnecting the fixed contact elements 4b, 4c thus providing a closed electrical path. Comparing graphs C1 and C3 illustrates clearly the energy savings that can be provided by means of the present teachings. The required energy after contact making is kept to a minimum, in particular by detecting the actual time for contact making. Thereby the prior art use of fixed time with safety margin can be abandoned. Further, by detecting the actual time for contact making it is ensured that robust contact making is indeed accomplished before switching to hold-state current.

Figure 5:
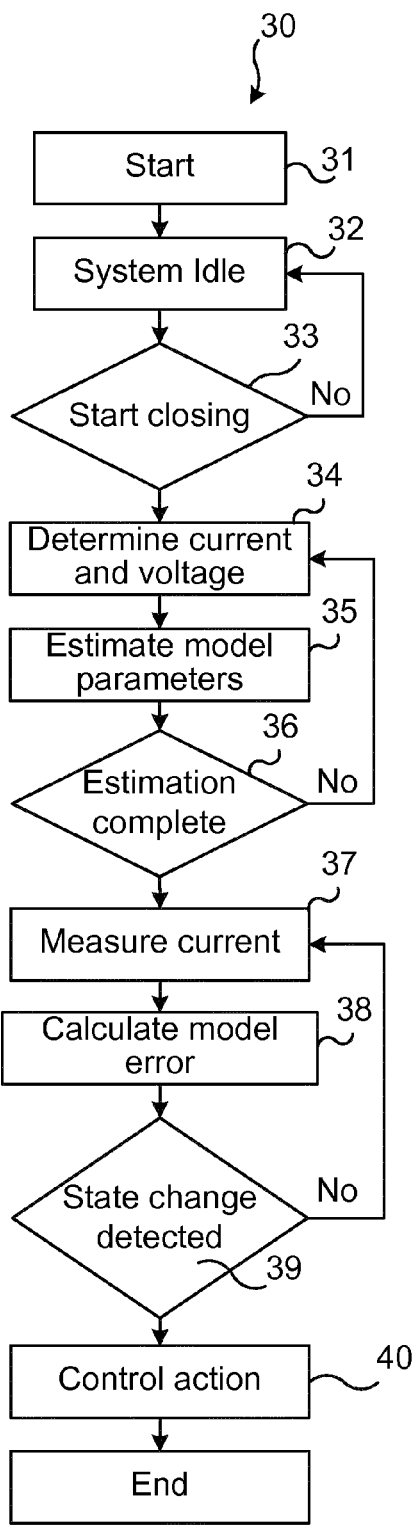
FIG. 5 illustrates an aspect of the present teachings in the form of a flow chart.
Figure 6:
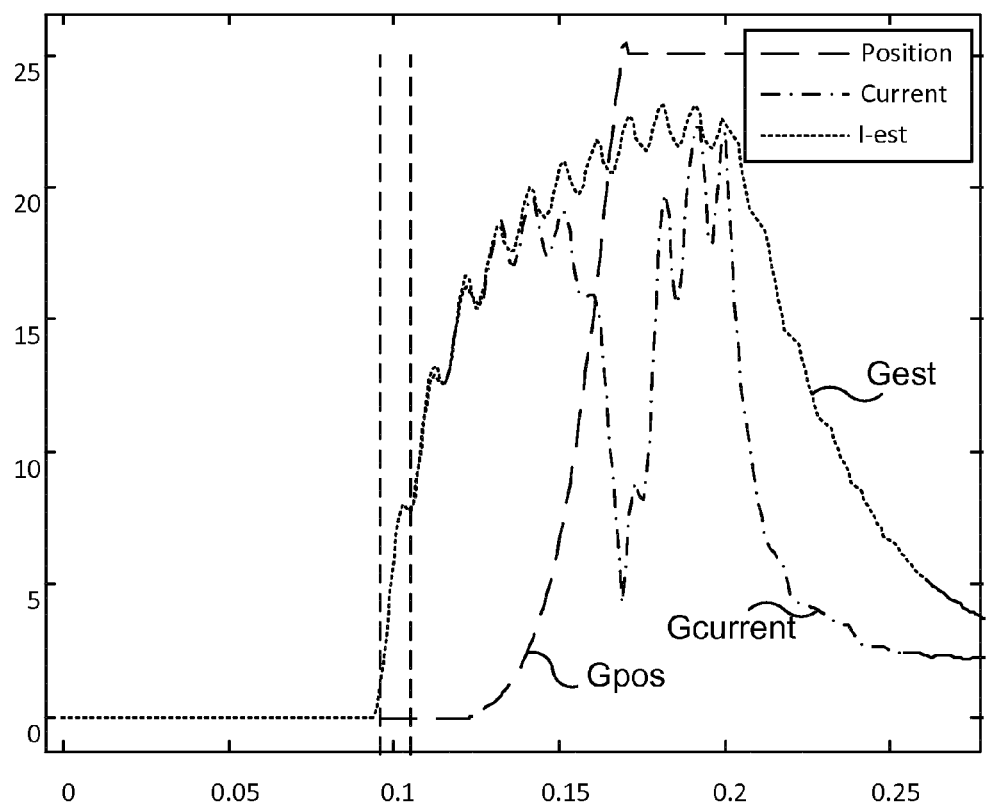
FIG. 6 illustrates an aspect of the present teachings in the form of graphs over parameterized model, measurements and position of contactor device.

FIG. 5 illustrates in a flow chart 20 an aspect of the present teachings. FIG. 6 comprises graphs further illustrating some of the steps of the flow chart 30. Both figures are referred to in the following.

Box 31 indicates the start of the flow 30. At box 32 the system, i.e. the contactor device 1, is idle, meaning that the contactor device 1 is in open state (break). At box 33 a starting of the closing of the contactor device 1 is initiated, such start may for example comprise applying a voltage over the coil 6. The start of closing may for example entail determining whether a closing sequence has been initiated e.g. by the control unit 12 or determining if a command for closing the contactor device 1 has been received, etc. If no, the system continues in its idle state. If the starting of the closing has begun the flow continues to box 34. In box 34, the current through the coil 6 is determined as well as the voltage over the coil 6. This determination may be done in different ways, for example by simply measuring the current through the coil 6 and the voltage over the coil 6. The voltage may be determined in alternative ways as well, for example based on already available information about the voltage or by measuring a voltage that is proportional to the voltage supplied to the coil 6.

Next, in box 35 parameters of a model are estimated, in particular comprising parameters such as current and voltage measurements over the coil 6. These measurements and estimations are continued during a period of time, for example until a time limit is reached or until the estimated parameters converge to adequate values. The decision on whether the estimation of model parameters should continue is thus taken (box 36).

In an aspect of the present teachings, the parameters are used for predicting the behavior of the contactor device 1 as a function of input signal (Voltage) and model state (Current). The model is parameterized when the contactor device 1 is in its open state, hence the model will predict the current through the coil 6 as if the contactor device 1 stayed in open state as a function of time, see graph denoted $G_{est}$ in FIG. 6.

Figure 7:
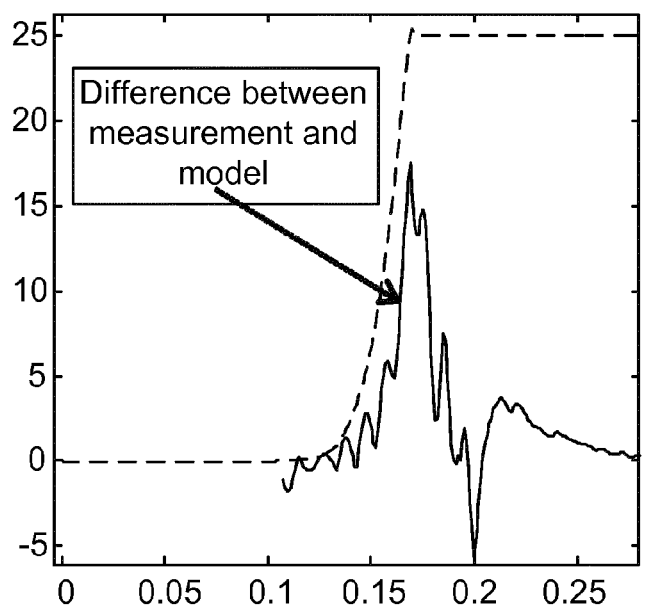
FIG. 7 illustrates an aspect of the present teachings, in particular a difference between measurements and a model.

The graph $G_{est}$ of FIG. 6 thus illustrates the predicted behavior of the current through the coil 6 if the contactor device 1 were to stay in its open state. The graph $G_{current}$ of FIG. 6 illustrates measurements made after a closing command has been received. The current over the coil will drop to a minimum when the contactor device 1 closes, but the actual time for this is difficult to determine, as has been described, for example due to variations in the current resulting from other factors than the current dip caused by the closing instant. The present teachings solve this difficulty by comparing the estimated current behavior with the measured current. When the difference between these currents is large enough, the closing time is determined to occur. As illustrated in FIG. 6, the carrier 8 position (graph $G_{pos}$) corresponds to a closed state of the contactor device when the measured current reaches a minimum (in particular a global minimum of the closing process). FIG. 7 illustrates the difference between the measurements and the model values.

If the decision of box 36 is no, then the determinations (box 34) and estimations (box 35) continue. If the decision of box 26 is yes, the flow continues to box 37.

In box 37, the current over the coil 6 is measured. A determined voltage over the coil 6 may, as mentioned earlier, be used as an input signal to the model. Such determined voltage may thus be used for predicting the current through the coil 6 (graph denoted $G_{est}$ of FIG. 6).

In box 38, the predicted current (graph $G_{est}$ of FIG. 6) is compared to the measured current (graph denoted $G_{current}$ of FIG. 6) and the outcome of this comparison is used in box 39 for taking a decision on whether the contactor device 1 has changed state or not. If it is determined in box 39 that no state change of the contactor device 1 has occurred, then the flow returns to box 37. If it is determined in box 39 that a state change of the contactor device 1 has occurred, then the flow continues to box 60.

Finally, in box 30, the flow 30 ends or a control action may be taken. For example, a control action related to the holding state such as reducing the current through the coil 6 for accomplishing the holding. The current may be reduced to a level suitable for holding while minimizing the power losses.

Figure 8:
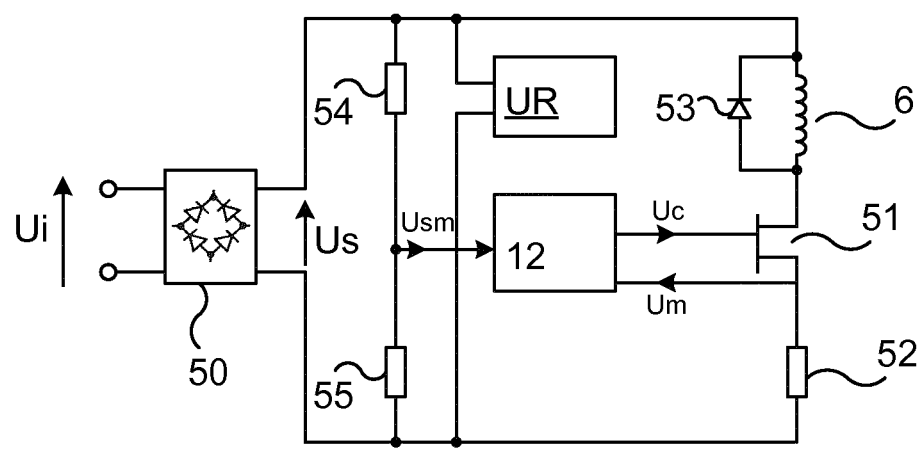
FIG. 8 illustrates a circuit diagram of the contactor device of FIG. 1.

FIG. 8 illustrates an exemplary circuit diagram representing an implementation of the contactor device 1 of FIG. 1. The voltage $U_i$ is supplied by the voltage source 9 (refer to FIG. 1). Closing of the contactor device 1 is performed by connecting the voltage source 9, while opening is performed by disconnecting the voltage source 9. The supply voltage may be supplied via a full-wave rectifier 50, the output voltage $U_s$ of which is a direct voltage if the supplied voltage is a direct voltage and a full-wave rectified alternating voltage if the supplied voltage is an alternating voltage. The output voltage $U_s$ is supplied to the coil 6 of the contactor device 1. The coil 6 is series-connected to a switching transistor 51 and a small series resistor 52, in the following denoted measuring resistor 52, arranged for current measurements. The coil 6 is connected in anti-parallel with a free-wheeling diode 53.

The control unit 12 is adapted to, with the aid of the transistor 51, control the voltage over the coil 6 by pulse-width modulation. The control unit 12 outputs a control signal $U_c$ to the gate of the transistor 51 and controls the transistor 51 with a constant pulse frequency and with a variable pulse width. The control unit 12 is supplied with a voltage $U_m$ occurring across the measuring resistor 52, which voltage is a measure of the current through the coil 6. A voltage divider formed by resistors 54, 55 arranged in parallel with the control unit 12 delivers a measured signal $U_{sm}$ to the control unit 12, which measured signal $U_{sm}$ is proportional to the voltage $U_s$.

Figure 9:
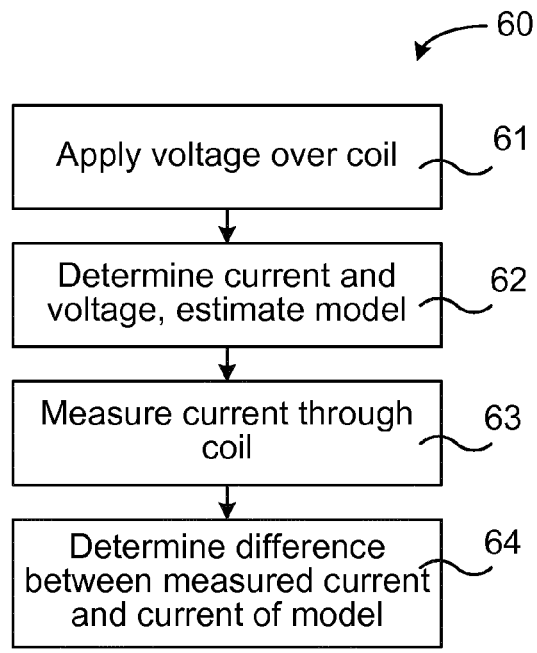
FIG. 9 illustrates a flow chart over steps of a method for controlling a contactor device in accordance with the present teachings.

FIG. 9 illustrates a flow chart over steps of a method for controlling, in particular for closing, a contactor device in accordance with the present teachings. The method 60 may be implemented in and performed by the control unit 12, which is configured or arranged to control a contactor device 1 as described, in particular for controlling the closing thereof. The contactor device 1 is thus movable between a closed position in which a current is allowed to flow in a current path and an open position in which the current path is broken. The control unit 12 is configured to enable the movement between the closed position and the open position by energizing a coil 6 of an electromagnetic circuit. The method 60 comprises applying 61 a voltage over the coil 6 of the contactor device 1.

The method 60 comprises determining 62, during a first period of time, current through the coil 6 and voltage over the coil 6 and estimating based thereon model parameters for a model that predicts the behavior of the current through the coil 6 if the contactor device 1 were to stay in an open position. The determining of the current through the coil 6 may be done simply by measuring the current. The determining of the voltage over the coil 6 may be done in different ways, as explained earlier, for example by simply measuring it. The determining of the voltage over the coil 6 may alternatively be done based on already available information about the voltage by measuring a voltage that is proportional to the voltage supplied to the coil 6. For exemplary ways of determining the voltage over the coil 6, refer also to FIG. 8 and related description.

The method 60 comprises measuring 63, after the ending of the first period of time, current through the coil 6 and determining 64 a difference between, on the one hand the measured current and, on the other hand a predicted current of the model. The measuring 63 and the determining 63 is repeated until a state change from open position to closed position is detected by the difference in current.

In an embodiment, the method 60 comprises, after the ending of the first period of time, determining the voltage over the coil 6 and using this voltage for determining the predicted current of the model. That is, when performing the comparisons of the measured current through the coil 6 and the predicted current of the model, the latter may be based on such voltage determination. The voltage determination may, as described above, be done in different ways, one way being to simply measure it.

In an embodiment, the first period of time comprises a predefined period of time or time elapsed from initiating the starting of the closing of the contactor device 1 until the estimated parameters converge to adequate values. The first period of time may comprise the time elapsed from the applying 61 of the voltage until the estimated parameters converge, in particular converge to adequate values.

In an embodiment, the method 60 comprises switching, at the determined closing time, from a first voltage to a second voltage. The first voltage may for example comprise a pull-in voltage providing a current in the coil 6 for initiating the movement between the closed position and the open position. The second voltage may for example comprise a hold voltage providing a current in the coil 6 for holding the contactor device 1 in the closed position.

In an embodiment, the detecting of a state change from open position to closed position is based on the difference in current being above a threshold value. The threshold value may for example be set to be greater than any current variations in the measured current caused by the use of rectified alternating current for the energizing of the coil 6, ensuring the difference to correspond to the closed position of the contactor device 1.

It is noted that the detecting of the state change to closed position based on the difference in current, i.e. for establishing that the contactor device 1 is in its closed position, may be done in alternative ways. For example by integrating the difference in currents over time and detecting the state change to closed position when the result of this integration is sufficiently high.

In an embodiment, the movement between the closed position and the open position by energizing the coil 6 of the electromagnetic circuit comprises energizing the coil 6 wound around a part of a magnet 5a, 5b of an electromagnet 10, so as to move a carrier 8, which is mechanically connected to the magnet 5a, 5b and comprises a moving contact element 4a, between the closed position in which the moving contact element 4a interconnects fixed contact elements 4b, 4c and the open position in which the moving contact element 4a breaks the electrical path between the fixed contact elements 4b, 4c.

Figure 10:
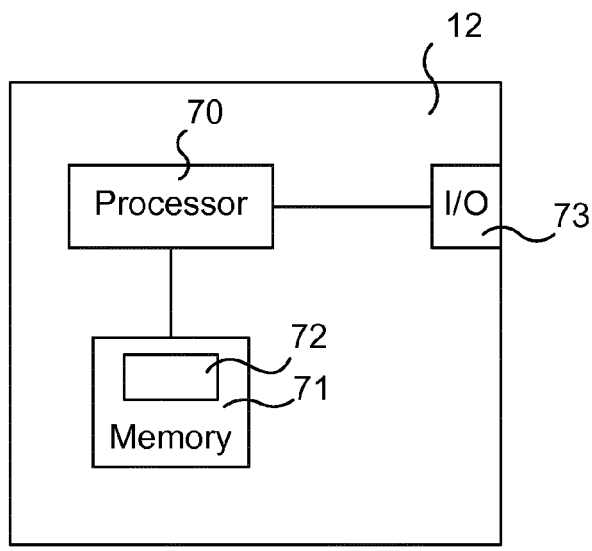
FIG. 10 illustrates a control unit adapted to control a contactor device in accordance with the present teachings.

FIG. 10 illustrates schematically the control unit 12 and means for implementing methods of the present teachings. The control unit 12 may comprise a processor 70 comprising any combination of one or more of a central processing unit (CPU), multiprocessor, microcontroller, digital signal processor (DSP), application specific integrated circuit etc. capable of executing software instructions stored in a memory 71, which can thus be a computer program product 71. The processor 70 can be configured to execute any of the various embodiments of the method as described in relation to FIG. 9.

Still with reference to FIG. 10, the memory 71 can be any combination of read and write memory (RAM) and read only memory (ROM). The memory 71 may also comprise persistent storage, which, for example, can be any single one or combination of magnetic memory, optical memory, solid state memory or even remotely mounted memory.

The control unit 12 may further comprise an input/output (I/O) device 73 for receiving data from external devices. For example, the I/O device 73 may be used for receiving measurements values from sensor devices 13, 14.

The control unit 12 is adapted to control the contactor device 1 as described. The control unit 12 is configured for closing a contactor device 1, wherein the contactor device 1 is movable between a closed position in which a current is allowed to flow in a current path and an open position in which the current path is broken. The control unit 12 is configured to enable the movement between the closed position and the open position by energizing a coil 6 of an electromagnetic circuit, as has been described. The control unit 12 is configured to perform various embodiments of the method 60 as described in relation to FIG. 9.

In particular, the control unit 12 is configured to apply a voltage over the coil 6; determine, during a first period of time, current through the coil 6 and voltage over the coil 6 and estimating based thereon model parameters for a model predicting the behavior of the current through the coil 6 if the contactor device 1 were to stay in an open position; and measure, after the ending of the first period of time, current through the coil 6 and determining 64 a difference between, on the one hand the measured current and, on the other hand a predicted current of the model, and repeating the measuring 63 and determining 64 until a state change from open position to closed position is detected by the difference in current.

In an embodiment, the control unit 12 is configured to, after the ending of the first period of time, determine the voltage over the coil 6 and use the voltage for determining the predicted current of the model.

In an embodiment, the first period of time comprises a predefined period of time or time elapsed from the applying of the voltage over the coil 6 until the estimated parameters converge.

In an embodiment, the control unit 12 is configured to switch, at the determined closing time, from a first voltage to a second voltage.

In a variation of the above embodiment, the first voltage comprises a pull-in voltage providing a current in the coil 6 for initiating the movement between the closed position and the open position.

In another variation of the above two embodiments, the second voltage comprises a hold voltage providing a current in the coil 6 for holding the contactor device 1 in the closed position.

In an embodiment, the control unit 12 is configured to detect based on the difference in current being above a threshold value.

In a variation of the above embodiment, the control unit 12 is configured to set the threshold value to be greater than any current variations in the measured current caused by the use of rectified alternating current for the energizing of the coil 6, ensuring the difference to correspond to the closed position of the contactor device 1.

In an embodiment, the control unit 12 is configured to effectuate the movement between the closed position and the open position by energizing the coil 6 of the electromagnetic circuit by energizing the coil 6 wound around a part of a magnet 5a, 5b of an electromagnet 10, so as to move a carrier 8, which is mechanically connected to the magnet 5a, 5b and comprises a moving contact element 4a, between the closed position in which the moving contact element 4a interconnects fixed contact elements 4b, 4c and the open position in which the moving contact element 4a breaks the electrical path between the fixed contact elements 4b, 4c.

The teachings of the present application also encompasses a computer program product 71 comprising a computer program 72 for implementing the methods as described above, and a computer readable means on which the computer program 72 is stored. The computer program product 71 may be any combination of read and write memory (RAM) or read only memory (ROM). The computer program product 71 may also comprise persistent storage, which for example can be any single one or combination of magnetic memory, optical memory or solid state memory.

The present teachings thus comprise a computer program 72 for a control unit 12 as described. The computer program 72 comprising computer program code, which, when run on the control unit 12 causes the control unit 12 to:
apply a voltage over the coil 6,
determine, during a first period of time, current through the coil 6 and voltage over the coil 6 and estimating based thereon model parameters for a model predicting the behavior of the current through the coil 6 if the contactor device 1 were to stay in an open position, and
measure, after the ending of the first period of time, current through the coil 6 and determining 64 a difference between, on the one hand the measured current and, on the other hand a predicted current of the model, and repeating the measuring 63 and determining 64 until a state change from open position to closed position is detected by the difference in current.

The invention claimed is:

1. A method performed in a control unit for closing a contactor device, the contactor device being movable between a closed position in which a current is allowed to flow in a current path and an open position in which the current path is broken, the control unit being configured to enable the movement between the closed position and the open position by energizing a coil of an electromagnetic circuit, the method comprising:
applying a voltage over the coil,
determining, during a first period of time, current through the coil and voltage over the coil and estimating based thereon model parameters for a model predicting the behavior of the current through the coil if the contactor device were to stay in an open position, and
measuring, after the ending of the first period of time, current through the coil and determining a difference between, on the one hand the measured current and, on the other hand a predicted current of the model, and repeating the measuring and determining until a state change from open position to closed position is detected by the difference in current.

2. The method as claimed in claim 1, comprising, after the ending of the first period of time, determining the voltage over the coil and using the voltage for determining the predicted current of the model.

3. The method as claimed in claim 1, wherein the first period of time comprises a predefined period of time or time elapsed from the applying of the voltage over the coil until the estimated parameters converge.

4. The method as claimed in claim 1, comprising switching, at the determined closing time, from a first voltage to a second voltage.

5. The method as claimed in claim 4, wherein the first voltage comprises a pull-in voltage providing a current in the coil for initiating the movement between the closed position and the open position.

6. The method as claimed in claim 4, wherein the second voltage comprises a hold voltage providing a current in the coil for holding the contactor device in the closed position.

7. The method as claimed in claim 1, wherein the detecting is based on the difference in current being above a threshold value.

8. The method as claimed in claim 7, comprising setting the threshold value to be greater than any current variations in the measured current caused by the use of rectified alternating current for the energizing of the coil, ensuring the difference to correspond to the closed position of the contactor device.

9. The method as claimed in claim 1, wherein the movement between the closed position and the open position by energizing the coil of the electromagnetic circuit comprises energizing the coil wound around a part of a magnet of an electromagnet, so as to move a carrier, which is mechanically connected to the magnet and comprises a moving contact element, between the closed position in which the moving contact element interconnects fixed contact elements and the open position in which the moving contact element breaks the electrical path between the fixed contact elements.

10. A control unit for closing a contactor device, the contactor device being movable between a closed position in which a current is allowed to flow in a current path and an open position in which the current path is broken, the control unit being configured to enable the movement between the closed position and the open position by energizing a coil of an electromagnetic circuit, the control unit being configured to:
  apply a voltage over the coil,
  determine, during a first period of time, current through the coil and voltage over the coil and estimating based thereon model parameters for a model predicting the behavior of the current through the coil if the contactor device were to stay in an open position, and
  measure, after the ending of the first period of time, current through the coil and determining a difference between, on the one hand the measured current and, on the other hand a predicted current of the model, and repeating the measuring and determining until a state change from open position to closed position is detected by the difference in current.

11. The control unit as claimed in claim 10, configured to, after the ending of the first period of time, determine the voltage over the coil and use the voltage for determining the predicted current of the model.

12. The control unit as claimed in claim 10, wherein the first period of time comprises a predefined period of time or time elapsed from the applying of the voltage over the coil until the estimated parameters converge.

13. The control unit as claimed in claim 10, configured to switch, at the determined closing time, from a first voltage to a second voltage.

14. The control unit as claimed in claim 13, wherein the first voltage comprises a pull-in voltage providing a current in the coil for initiating the movement between the closed position and the open position.

15. The control unit as claimed in claim 13, wherein the second voltage comprises a hold voltage providing a current in the coil for holding the contactor device in the closed position.

16. The control unit as claimed in claim 10, configured to detect based on the difference in current being above a threshold value.

17. The control unit as claimed in claim 16, comprising setting the threshold value to be greater than any current variations in the measured current caused by the use of rectified alternating current for the energizing of the coil, ensuring the difference to correspond to the closed position of the contactor device.

18. The control unit as claimed in claim 10, configured to effectuate the movement between the closed position and the open position by energizing the coil of the electromagnetic circuit by energizing the coil wound around a part of a magnet of an electromagnet, so as to move a carrier, which is mechanically connected to the magnet and comprises a moving contact element, between the closed position in which the moving contact element interconnects fixed contact elements and the open position in which the moving contact element breaks the electrical path between the fixed contact elements.

* * * * *